(12) United States Patent
Todd et al.

(10) Patent No.: US 8,088,223 B2
(45) Date of Patent: Jan. 3, 2012

(54) SYSTEM FOR CONTROL OF GAS INJECTORS

(75) Inventors: Michael A. Todd, Phoenix, AZ (US); Keith D. Weeks, Gilbert, AZ (US); Paul T. Jacobson, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 881 days.

(21) Appl. No.: 11/373,408

(22) Filed: Mar. 9, 2006

(65) Prior Publication Data

US 2006/0216417 A1 Sep. 28, 2006

Related U.S. Application Data

(60) Provisional application No. 60/661,293, filed on Mar. 10, 2005.

(51) Int. Cl.
*C23C 16/455* (2006.01)
*C23C 16/52* (2006.01)
*C23C 16/06* (2006.01)
*C23C 16/22* (2006.01)

(52) U.S. Cl. ........ 118/715; 118/695; 118/696; 118/697; 156/345.33; 156/345.34

(58) Field of Classification Search .................. 118/715, 118/695, 696, 697; 156/345.33, 345.34
See application file for complete search history.

(56) References Cited

U.S. PATENT DOCUMENTS

| | | | |
|---|---|---|---|
| 4,369,031 A | 1/1983 | Goldman et al. | |
| 4,595,601 A * | 6/1986 | Horioka et al. | 438/695 |
| 4,612,077 A | 9/1986 | Tracy et al. | |
| 4,761,269 A * | 8/1988 | Conger et al. | 118/679 |
| 4,793,283 A | 12/1988 | Sarkozy | |
| 4,854,263 A | 8/1989 | Chang et al. | |
| 4,902,572 A | 2/1990 | Horne et al. | |
| 4,980,204 A * | 12/1990 | Fujii et al. | 117/98 |
| 5,024,182 A | 6/1991 | Kobayashi et al. | |
| 5,221,556 A * | 6/1993 | Hawkins et al. | 427/255.17 |
| 5,250,323 A | 10/1993 | Miyazaki | |
| 5,269,847 A | 12/1993 | Anderson et al. | |
| 5,304,247 A | 4/1994 | Kondo et al. | |
| 5,413,671 A | 5/1995 | Ketchum | |
| 5,421,288 A * | 6/1995 | Ohta et al. | 117/88 |
| 5,453,124 A | 9/1995 | Moslehi et al. | |
| 5,455,070 A | 10/1995 | Anderson et al. | |
| 5,487,358 A * | 1/1996 | Ohta et al. | 117/200 |
| 5,500,256 A * | 3/1996 | Watabe | 427/579 |
| 5,551,982 A | 9/1996 | Anderson et al. | |
| 5,589,110 A * | 12/1996 | Motoda et al. | 261/61 |
| 5,650,082 A * | 7/1997 | Anderson | 219/390 |
| 5,702,530 A | 12/1997 | Shan et al. | |
| 5,849,092 A * | 12/1998 | Xi et al. | 134/1.1 |
| 5,888,907 A * | 3/1999 | Tomoyasu et al. | 438/714 |
| 5,948,168 A | 9/1999 | Shan et al. | |

(Continued)

FOREIGN PATENT DOCUMENTS

JP 01-305524 12/1989

(Continued)

*Primary Examiner* — Rudy Zervigon
(74) *Attorney, Agent, or Firm* — Knobbe, Martens, Olson & Bear, LLP

(57) ABSTRACT

A substrate processing system has computer controlled injectors. The computer is configured to adjust a plurality of injectors, such as during deposition of a graded layer, between depositions of two different layers, or between deposition and chamber clean steps.

15 Claims, 8 Drawing Sheets

U.S. PATENT DOCUMENTS

| | | | |
|---|---|---|---|
| 5,948,958 A | 9/1999 | Bang et al. | |
| 5,976,261 A | 11/1999 | Moslehi et al. | |
| 5,993,555 A * | 11/1999 | Hamilton | 118/715 |
| 6,003,535 A | 12/1999 | Ollivier | |
| 6,022,412 A | 2/2000 | Vincenzo et al. | |
| 6,143,080 A | 11/2000 | Bartholomew et al. | |
| 6,162,323 A * | 12/2000 | Koshimizu | 156/345.26 |
| 6,185,839 B1 | 2/2001 | Kholodenko et al. | |
| 6,187,091 B1 * | 2/2001 | Hamilton | 117/89 |
| 6,217,659 B1 | 4/2001 | Botelho et al. | |
| 6,291,800 B1 * | 9/2001 | Shirakawa et al. | 219/390 |
| 6,328,221 B1 | 12/2001 | Moore et al. | |
| 6,333,272 B1 | 12/2001 | McMillin et al. | |
| RE37,546 E | 2/2002 | Mahawili | |
| 6,347,749 B1 | 2/2002 | Moore et al. | |
| 6,352,594 B2 | 3/2002 | Cook et al. | |
| 6,380,518 B2 * | 4/2002 | Shirakawa et al. | 219/390 |
| 6,572,924 B1 | 6/2003 | Halpin | |
| 6,818,249 B2 * | 11/2004 | Derderian | 427/248.1 |
| 6,821,347 B2 * | 11/2004 | Carpenter et al. | 118/696 |
| 6,838,114 B2 * | 1/2005 | Carpenter et al. | 427/8 |
| 6,861,094 B2 * | 3/2005 | Derderian et al. | 427/248.1 |
| 6,884,296 B2 * | 4/2005 | Basceri et al. | 118/715 |
| 6,927,140 B2 * | 8/2005 | Soman et al. | 438/309 |
| 7,238,595 B2 * | 7/2007 | Brabant et al. | 438/481 |
| 7,323,231 B2 * | 1/2008 | Derderian | 427/576 |
| 7,387,685 B2 * | 6/2008 | Carpenter et al. | 118/715 |
| 7,402,504 B2 * | 7/2008 | Brabant et al. | 438/481 |
| 7,655,543 B2 * | 2/2010 | Bauer | 438/478 |
| 7,682,947 B2 * | 3/2010 | Brabant et al. | 438/481 |
| 7,846,497 B2 * | 12/2010 | Gold et al. | 427/248.1 |
| 7,897,491 B2 * | 3/2011 | Bauer | 438/478 |
| 7,939,447 B2 * | 5/2011 | Bauer et al. | 438/680 |
| 2001/0009138 A1 | 7/2001 | Botelho et al. | |
| 2001/0013363 A1 | 8/2001 | Kitayama et al. | |
| 2002/0042205 A1 | 4/2002 | McMillin et al. | |
| 2002/0185062 A1 | 12/2002 | Halpin | |
| 2004/0003777 A1 * | 1/2004 | Carpenter et al. | 118/715 |
| 2004/0035358 A1 * | 2/2004 | Basceri et al. | 118/715 |
| 2004/0048439 A1 * | 3/2004 | Soman et al. | 438/309 |
| 2004/0107897 A1 | 6/2004 | Lee et al. | |
| 2004/0219735 A1 * | 11/2004 | Brabant et al. | 438/222 |
| 2006/0216417 A1 * | 9/2006 | Todd et al. | 427/248.1 |
| 2007/0228470 A1 * | 10/2007 | Levy | 257/348 |

FOREIGN PATENT DOCUMENTS

| | | |
|---|---|---|
| JP | 03131594 | 5/1991 |
| JP | 06151338 | 5/1994 |
| WO | WO 89/12703 | 12/1999 |

* cited by examiner

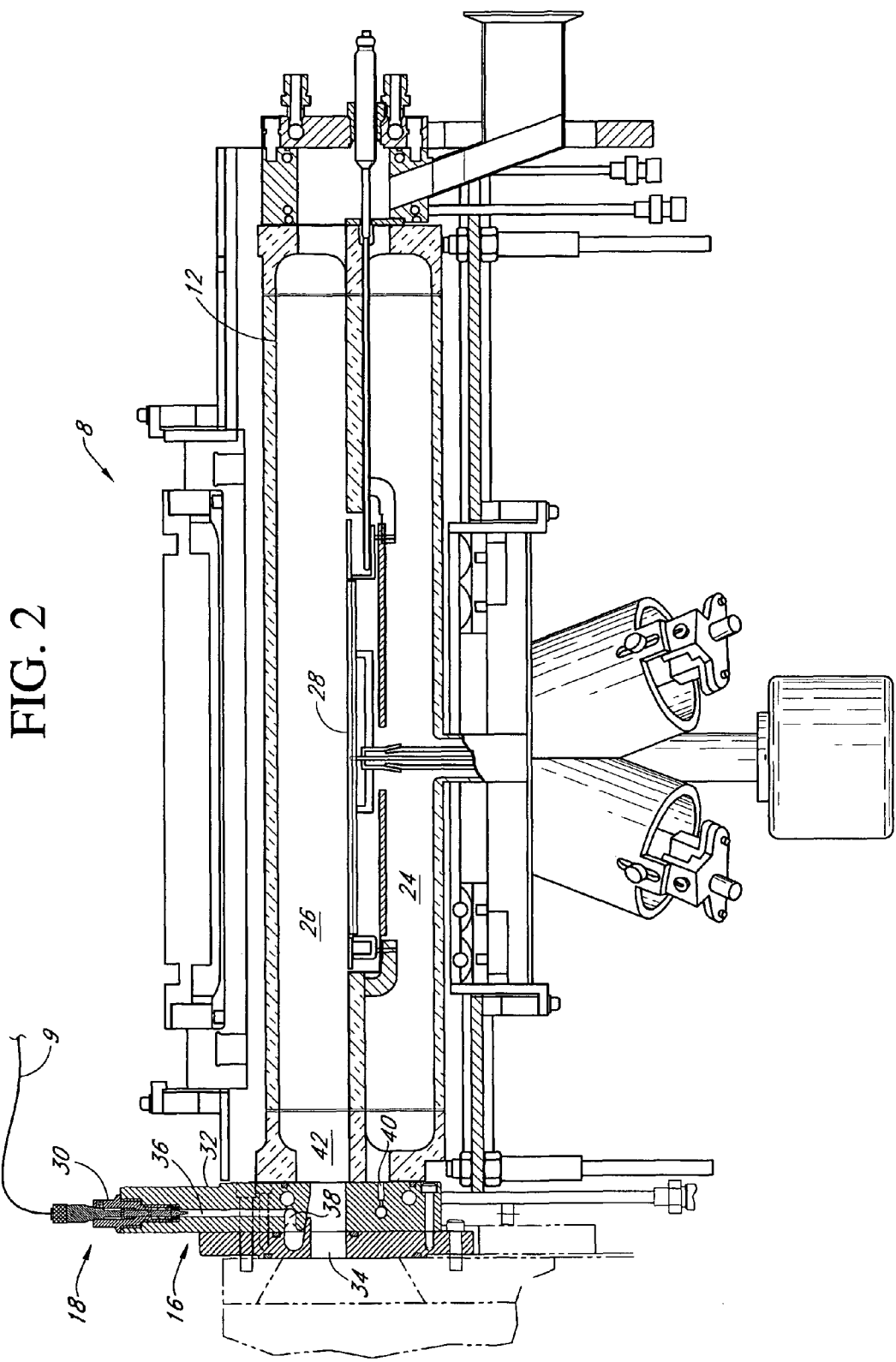

SYSTEM FOR CONTROL OF GAS INJECTORS

CLAIM FOR PRIORITY

This application claims priority to Provisional application No. 60/661,293, filed Mar. 10, 2005.

BACKGROUND OF THE INVENTION

1. Field of the Invention

The present invention relates, in general, to the processing of substrates and, more specifically, to process gas injection systems.

2. Description of the Related Art

In semiconductor device fabrication, a substrate or wafer is subjected to a number of processes in order to deposit or remove a layer from the wafer. Many of these processes involve the injection of gases into a reaction chamber containing the wafer. These gases can include, for example, reactive gases injected to deposit a layer on the substrate. In addition, inert gases can also be injected into the reaction chamber to purge reactive gases from the chamber between reactive steps. Injection systems for injecting these gases generally include gas sources (such as gas tanks, bubblers, other liquid and/or solid vaporization devices) connected via piping to injectors which use valves to control the injection of gases into the reaction chamber. Mass flow controllers and valves are adjusted in order to select the type and amount of the desired source gas(es) to inject into the reaction chamber. In addition, the gas injectors in a bank of injectors are normally manually tuned for gas flow uniformity in advance of processing.

Generally, during processing of a wafer in a reaction chamber, if different injector settings are needed, the chamber is shut down and purged in order to adjust the injector valves to the desired setting. This is a time consuming process. Accordingly, rather than adjusting tool settings between process steps, wafers are often processed using multi-chamber process tools (e.g., a cluster tool), where a series of individual chambers are each optimized for separate process steps. This allows injectors to be set properly for each separate process step. For instance, a wafer can be subjected to a deposition reaction in one chamber and an etch treatment in another chamber. Injector settings are parameters typically tuned to provide uniform exposure of the substrate to gases.

SUMMARY OF THE INVENTION

In accordance with one embodiment, a method of forming a layer on a substrate is provided comprising loading a substrate into a process chamber and injecting initial process gases from injectors across the substrate. The injectors are adjusted while injecting the process gas across the substrate after injecting the initial process gases. Additional process gases are injected through the injectors across the substrate after adjusting the injectors and before removing the substrate from the chamber.

In accordance with another embodiment, a method of performing a process step on a substrate is provided comprising injecting a gas flow substantially parallel to a surface of the substrate with the gas flow originating from a plurality of injectors having a first configuration. A control signal is outputted from a computer to an adjustment mechanism of the plurality of injectors. The adjustment mechanism is activated to adjust the plurality of injectors into a second configuration.

In accordance with yet another embodiment, a method is provided for grading a layer of an integrated circuit to have a ratio of a component X to a component Y which varies along a vertical gradient. A gas is injected from injectors onto a substrate and the configuration of the injectors is altered while depositing the layer.

In accordance with another embodiment, a substrate processing system is provided comprising an enclosed reaction space, a substrate holder in the reaction space, and a computer. In addition, a plurality of injectors are oriented to produce a substantially horizontal process flow, each one of the plurality of injectors having an injector control mechanism controllably linked to the computer.

In accordance with another embodiment, an injection system for use in a substrate process chamber is provided. The system includes a bank of laterally arrayed injectors and a computer controlled injector adjustment mechanism having a computer interface allowing the mechanism to be capable of being controlled by a computer.

Advantageously, the preferred embodiments allow injector settings to be optimized for each individual step, process, and/or phase in a processing recipe. For example, a feature of certain preferred embodiments is the ability to adjust the injectors associated with a chamber so that a single chamber can be employed for processes that include multiple different injector settings. Furthermore, these preferred embodiments do not require the wafer to be transferred between different chambers in order to subject the wafer to processes having different injector settings. Instead, a computer controlled injection system is provided that enables the injectors to be adjusted quickly and accurately between process steps, so that one chamber can be used during processing for disparate, sequential processes. Preferably the adjustments are preprogrammed. The settings can be adjusted in accordance with a preselected temporal profile of the injector settings (i.e., a profile indicating, for one or more of the injectors, the degree of the injector's openness as a function of time).

Another feature of certain preferred embodiments is to adjust the injectors to allow the cleaning of a reaction chamber between one or more deposition steps. For example, deposition processes are conducted in the reaction chamber until unwanted deposition on the chamber walls reaches a predetermined thickness. At this point the injectors are adjusted for the injection of cleaning agents (e.g., etchants), which may be concentrated toward areas of equipment more subject to deposition build-up, into the chamber. After cleaning, the injectors are adjusted to settings appropriate for deposition. In this way, the injector settings can be optimized for different processes.

Yet another feature of certain preferred embodiments is the ability to grade a layer by programming a computer to adjust the injectors during a deposition step or mid-recipe. As a result, a functional layer can be deposited, in a single step, to have a composition which varies across the height of the layer. For example, a silicon germanium layer can be deposited with a graded germanium content, and different injector settings can be used at different stages of the deposition.

Yet another advantage of preferred embodiments which include real-time processing feedback sensors is the ability to correct (or partially alleviate) certain undesirable layer characteristics during a deposition/etch step. As a result, in the instance of correctable errors, it is possible to both increase the precision of a deposition/etch step and, also, reduce the number of "scrapped" wafers.

For the purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2 is a cross-sectional view illustrating a substrate processing system used in conjunction with a preferred embodiment of the present invention.

DETAILED DESCRIPTION OF THE PREFERRED EMBODIMENT

Figure 1:
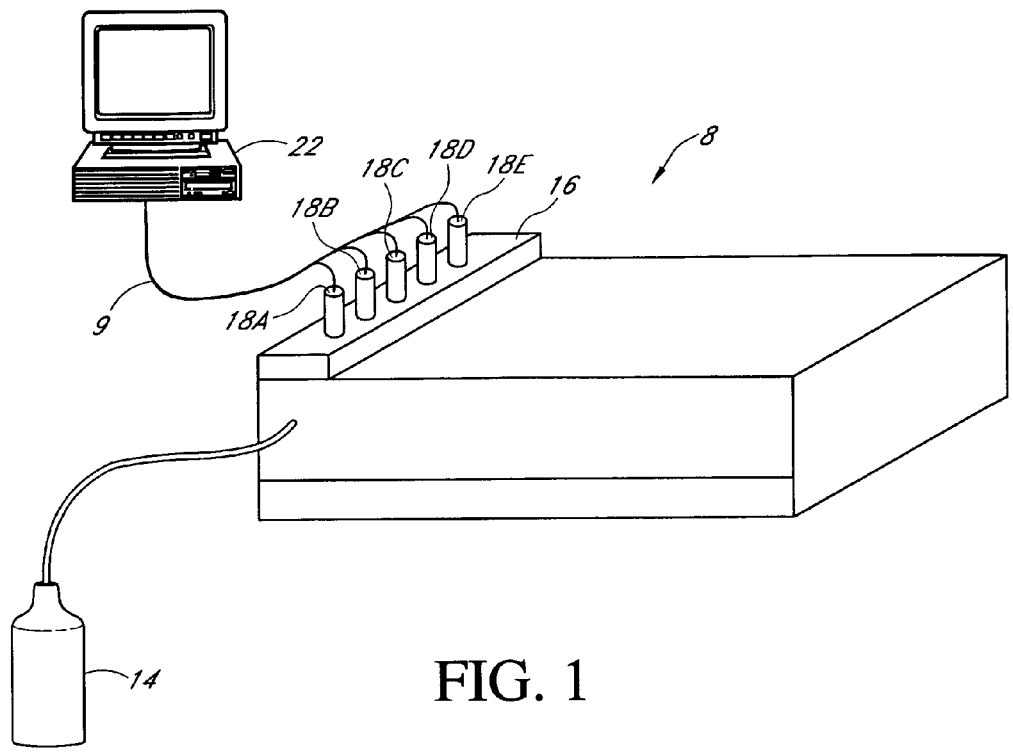
FIG. 1 is a schematic diagram of a computer controlled injector system, in accordance with a preferred embodiment.

Embodiments of the invention relate to methods and systems for electronically adjusting the delivery of reaction gases to a reaction chamber during semiconductor processing. It is generally desirable for the deposited film in a chemical vapor deposition reaction to be as uniform as possible in both thickness and elemental composition. However, existing processes tend to produce films that are non-uniform to varying degrees. Imperfect control over process parameters, including gas flow rates, total pressure, and temperature variations across the surface of the substrate, are believed to contribute to non-uniformities in the physical properties of deposited films. This process of improving the parameters involved in semiconductor manufacturing is known as "tuning".

Uniformity is often sought by empirically tuning the deposition conditions to achieve an overall uniform thickness for the desired film. Tuning can be performed by, for example, adjusting the gas flow rate of injector settings, the rotation speed of a substrate, and power distribution to heating elements. Empirical data on uniformity can be gathered by first depositing a large number of films on different substrates, each under a different pre-selected set of deposition conditions. The thickness variations within each film are then measured and the results analyzed to identify conditions that would eliminate the thickness variations. Unfortunately, the inventors have found that this empirical process does not necessarily achieve uniform deposition conditions throughout the process; rather, the process effectively time-averages the thickness variations produced by the temperature variations for a specific reaction temperature 'set-point'.

Accordingly, this empirical approach does not necessarily produce uniform films across the substrate throughout the deposition process. Similarly, selecting a process parameter for a given deposition condition by averaging optimal settings does not result in optimized conditions throughout the process. This, in turn, raises the issue of compositional variation because compositional homogeneity (or at least control) is desired in three dimensions, both across the film surface and through the film thickness. This is because many films contain dopants and the level of these dopants influences the electronic properties of the deposited film. In the case of graded layers, compositional homogeneity is desired across the film surface and a high level of control is desired to grade the relative concentration of the deposited materials throughout the film thickness.

Without wishing to be limited by theory, one possible explanation for different injector settings optimizing deposition at different stages of a single (e.g., graded) deposition, or during deposition of different materials relates to changing temperature control under different conditions. In particular, a growing layer or layers of different materials will exhibit different emissivities. Different emissivities, in turn, can lead to different temperature sensor readings and reactions by zoned heating. Accordingly, temperature non-uniformities can arise that are compensated by different gas flow distributors.

Well-controlled and reproducible deposition processes are highly desirable in order to maximize the yield and production rate of semiconductor devices. Imperfect control over deposition conditions, including temperature, gas flow rates and total pressure, can contribute to non-uniformities in the physical properties of deposited layers, and result in reduced semiconductor yields.

Because of these process variations, the rate of deposition at any particular instant varies as a function of position on the film, resulting in thickness variations across the surface of the film. Similarly, the composition of the film that is being deposited at any particular instant in time varies from place to place across the surface of the substrate for multi-component films. This means that the averaging-out/tuning approaches discussed below do not necessarily solve the problem of compositional non-uniformity.

In many cases, manufacturing involves depositing Si-containing films during the process of making thousands or even millions of devices simultaneously on a wafer that is 200 millimeters (mm) in diameter. The industry is transitioning to 300 mm wafers, and may use even larger wafers in the future. Significant variations in the thickness and/or composition of the Si-containing films during the manufacturing process can lead to lower manufacturing yields when the affected devices do not meet the required performance specifications or standards. Also, variations across the film within a particular device can reduce device performance and/or reliability.

The problem of deposition non-uniformity is particularly acute when depositing very thin Si-containing films. The ability to produce thin films is becoming increasingly important as circuit dimensions shrink and the resultant devices become more compact. However, the averaging-out/tuning approaches described above are becoming increasingly inadequate because the deposition process time for a thin film is generally shorter than for a thick film, allowing less time for film thickness to average-out. In addition, highly compact devices are more sensitive to compositional non-uniformities, a problem that is not adequately addressed by averaging-out/reactor tuning.

In contrast to the limitations of the above-described averaging out/reactor tuning approach employing a single suboptimal injector setting, preferred embodiments allow for multiple optimized injector settings for each individual step, process, and/or phase in a processing recipe.

With reference to FIG. 1, a reactor 8 preferably configured for chemical vapor deposition (CVD) processes is shown. Gas sources 14 supply reaction gases to the reactor 8 through an injector block 16 by way of a series of injectors 18A-E. The injectors 18A-E control entry of reaction gas mixtures (typically including one or more reactant vapors and carrier gas) from the sources 14 to the reactor 8. Gases from reactant and inert sources 14 are preferably merged or mixed at or upstream of the injector block 16. The injectors 18A-E are operatively connected (e.g., via a link, such as a wire 9 or via wireless signals) to a computer 22 configured to adjust electronic valves (not shown) within injectors 18A-E. Preferably, the computer 22 includes software which enables an operator to preload process recipes enabling adjustment of the injectors 18 during a recipe step or as necessary during substrate processing.

FIG. 2 illustrates a cross-sectional view of a preferred embodiment of the reactor 8 that includes a horizontal flow reaction chamber 12 and the injection block 16. The chamber 12 defines a cold wall reaction space including a lower region 24 and an upper region 26 into which the injectors 18A-E inject a process flow. A susceptor 28 is configured to support a substrate (not shown) in the upper region 26. The chamber 12 also preferably includes radiant heat lamps (not shown). Substrates are introduced into the chamber 12 through an opening 34.

As illustrated, mixed gases from the injectors 18A-E (one visible in FIG. 2) flow down a narrow conduit 36 and expansion chamber 38 prior to being introduced into an inlet aperture 42 of the upper region 26. Associated with each injector 18 is an electronically controlled valve 30. In one preferred embodiment, there are five such electronic valves 30A-E distributed evenly and centered across a rear flange 32 of the reactor 8. Of course, the invention is not limited to a particular number of injectors 18 or electronic valves 30. In one preferred embodiment, the needle valves are configured to adjust the flow of mixed gas through the gas injectors 18 and into the process chamber 12. In this respect, process gas enters through an inlet conduit 31 (FIG. 4) at one lateral edge of the rear flange 32 and is distributed through the gas injectors 18A-E, eventually entering the process chamber 12 through the expansion chamber 38. The computer 22 (FIG. 1) preferably controls each electronic valve 30 independently in order to provide the most advantageous distribution of process flow into the chamber.

As described above, the narrow conduit 36 extends into communication with the expansion chamber 38. The expansion chamber 38 is preferably segregated by flow dividers (not shown). There are five such expansion chambers 38 formed with flow dividers (not shown) provided therebetween, i.e., one expansion chamber 38 for each injector 18.

Figure 3:
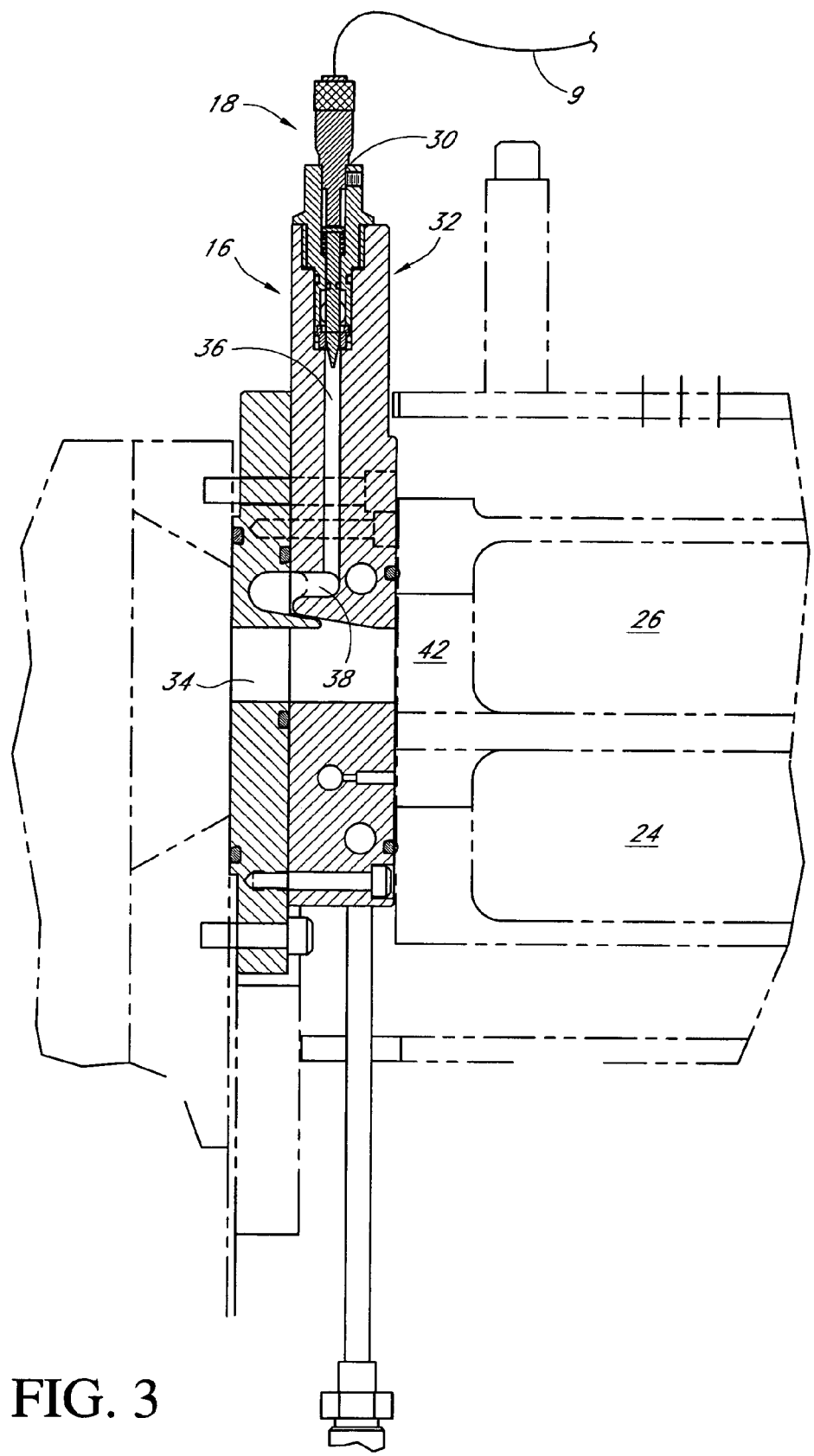
FIG. 3 is a detailed cross-sectional view of the gas injector system shown in FIG. 2.

FIG. 3 provides a magnified view of one of the injectors 18A-E shown in FIG. 2. As illustrated, the injectors 18A-E each comprises an electronic valve 16A-E for injecting a process flow into the chamber 26. Mixed gases from each of the injectors 18A-E flow through its associated narrow conduit 36, into its associated expansion chamber 38 and then are introduced into the upper region 26 of the reactor 8.

As shown in the foregoing figures, in this embodiment there are multiple electronic valves 30 employed to individually adjust each injector 18. In one preferred embodiment, the electronic valves 30 are capable of controlling the degree to which the injectors 18 are open, from 0-100% open, in precise gradations. The degree to which a valve 30 is open is preferably based upon a proportionally varied voltage of the control signal. For example, a Qualiflow Piezo Fast Valve with a "W" surface mount from Qualiflow of Montepellier, France can be employed with a control voltage ranging from 0-5 volts.

Figures 9A, 9B:
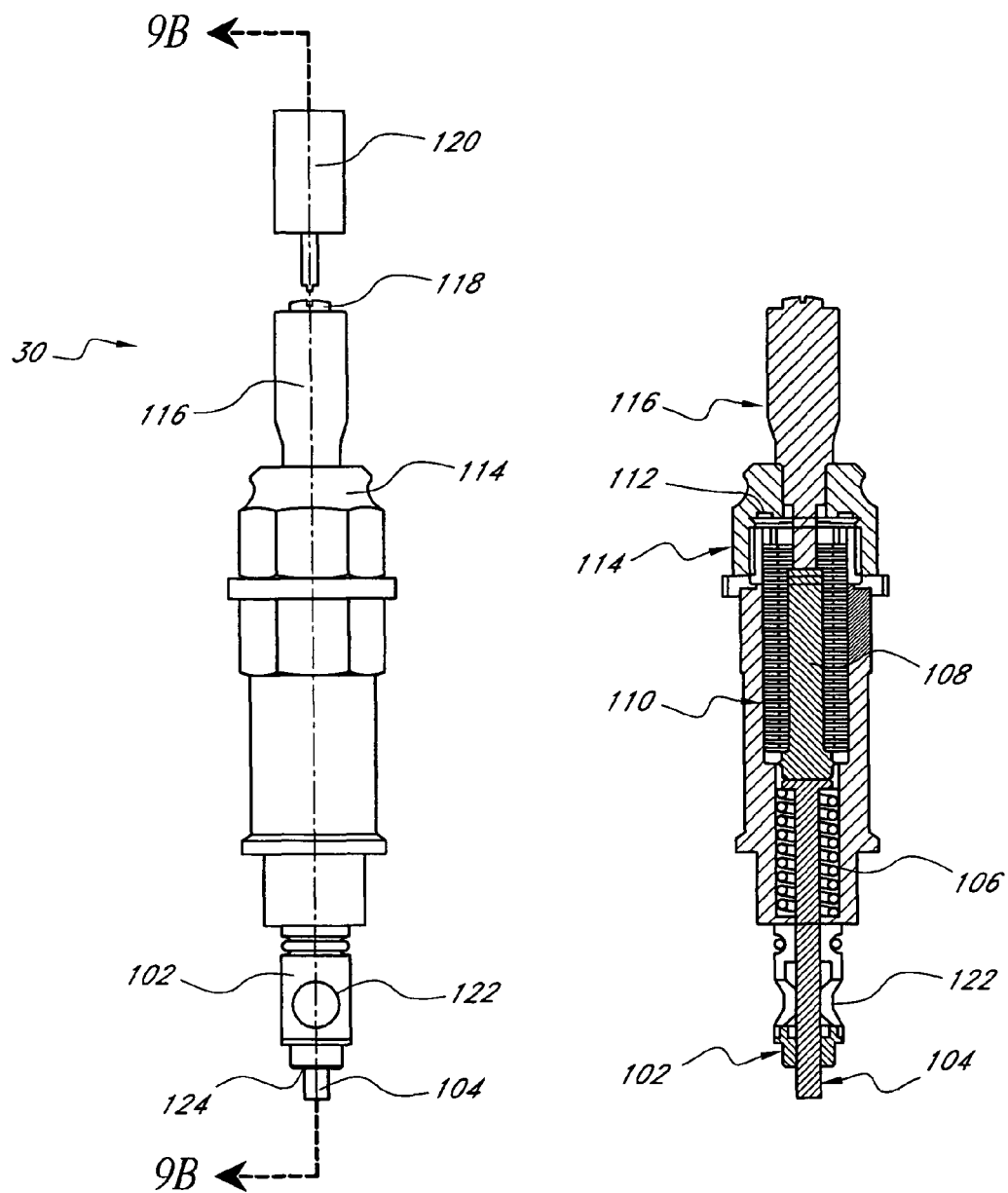
FIG. 9A is a side view of a motorized, electronically controllable gas injection valve, in accordance with one embodiment.
FIG. 9B is a sectional view taken along line 9B-9B of FIG. 9A.

FIGS. 9A and 9B show a suitable valve configuration for the electronic valves 30, in accordance with one embodiment of the invention. The illustrated motorized valve 30 comprises a cartridge 102 housing a needle 104, a spring 106, a pushrod 108, a bellows 110, and a compression disk 112. The illustrated coil spring 106 has a lower end bearing against a shoulder of the cartridge 102, and an upper end bearing against an upper flange of the needle 104. The valve 30 receives gases through a side port 122 of the cartridge 102. The gas is then injected through an annular gap between the needle 104 and a bottom orifice 124 of the cartridge 102. The needle 104 preferably has a somewhat conical shape that protrudes through the orifice 124, it being understood that the size of the annular gap varies with the vertical position of the needle 104 relative to the cartridge 102. Secured at an upper end of the cartridge 102 is a compression nut 114, which in turn has a threaded engagement with a micrometer head 116. The micrometer head 116 has an upper engagement at 118 with a motor 120. The motor 120 is not shown in FIG. 9B.

In use, the rotational output of the motor 120 rotates the micrometer head 116. Due to its threaded engagement with the compression nut 114, the rotation of the micrometer head 116 displaces it vertically with respect to the compression nut 114 and cartridge 102. This vertical displacement of the micrometer head 116 results in identical displacement of the pushrod 108, due in part to the upward force of the spring 106 thereon. Thus, adjustment of the injectors 18 and valves 30 preferably comprises electronically controlling the motors 120 associated with the injectors 18.

Figure 4:
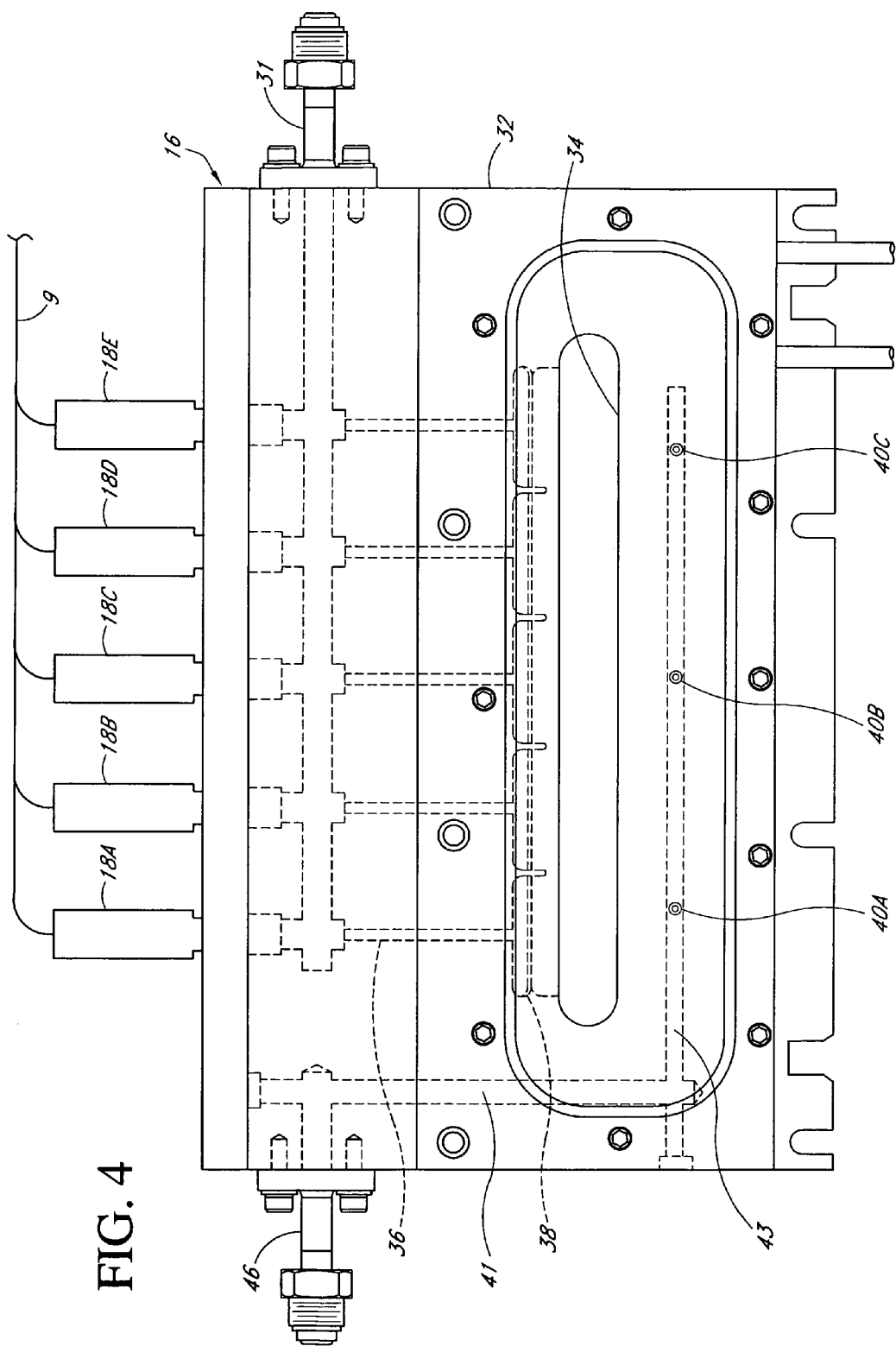
FIG. 4 is a rear elevational view of the gas injector system of FIG. 3 shown detached from the processing chamber.

As best seen in FIG. 4, the reactor 8 is further provided with purge gas channels 41, 43 and three purge gas apertures 40A-C opening into the lower region 24 (FIG. 3) of the process chamber 12. Process gas (including reactant(s) and inert carrier gas mixtures) flows through the entry slot 34 and inlet aperture 42 into the upper region 26 of the chamber 12, while purge gas flows through the three apertures 40A-C and purge inlet aperture into the lower region 24 (FIG. 3) of the chamber 12. A purge gas inlet 46 is provided on the lateral edge of the rear flange half 32 opposite the process gas inlet conduit 31.

Further detail regarding the preferred horizontal flow reactor and injection block can be found in U.S. Pat. No. 6,093,252 to Wengert et al., the disclosure of which is hereby incorporated by reference in its entirety.

Figure 5A:
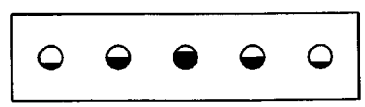
FIGS. 5A-5B are schematic views of the injector block showing examples of valve configurations possible during or between process step(s).
Figure 5B:
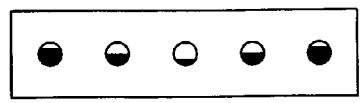

FIGS. 5A and 5B illustrate two examples of possible injector configurations with which the valves 30 can be adjusted by the computer 22 to provide varying control over the input reaction gases. As indicated, each of the valves 30 can be individually adjusted to provide a controlled distribution of gas at a particular step in the process. As indicated, in the illustrated embodiments, the valves are adjusted to provide a symmetrical distribution of reaction gas horizontally across the chamber 12. In embodiments where the wafer does not rotate, asymmetrical distribution may optimize deposition uniformity.

In one preferred embodiment, a method of forming a layer on a substrate is provided in which a process gas is injected into the process chamber and the injectors are adjusted while injecting the process gas across the substrate. Preferably, this adjustment is effectuated using computer control to produce a primary gas flow which travels the length of a reactor containing the substrate. By adjusting the valves within the injectors during process flow, one can vary the distribution of the process gas across the substrate (and distribution of materials deposited), as well as the concentration of materials being deposited onto the substrate.

Figure 6:
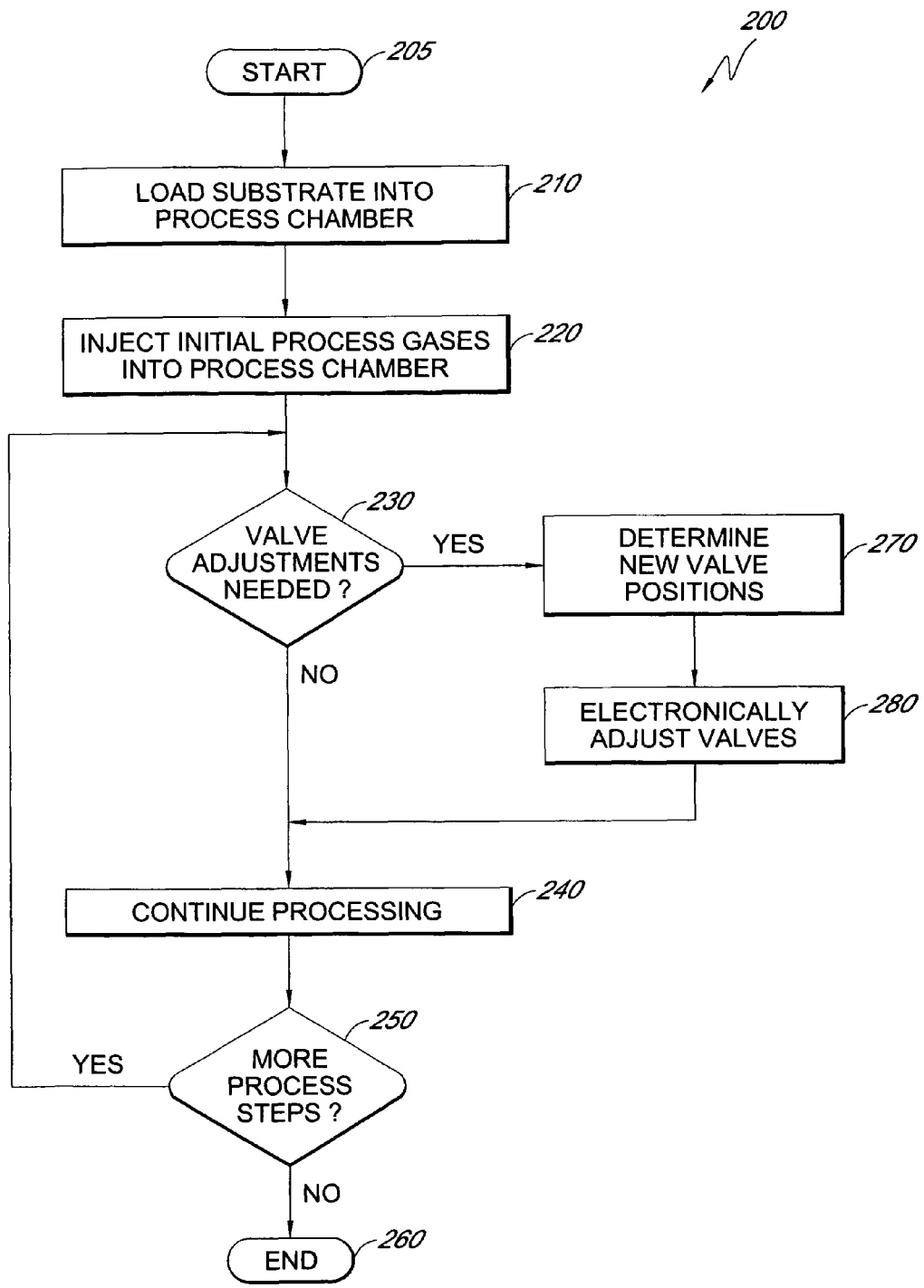
FIG. 6 is a flowchart of a process of adjusting injectors during a process step, in accordance with a preferred embodiment.

FIG. 6 shows one embodiment of a method of performing a process step (e.g., a CVD process step) on a substrate using injectors comprising computer controlled valves. The process 200 is initiated at a start state 205 and then moves to a state 210 wherein a substrate is loaded into a process chamber. Once the substrate is loaded into the process chamber, the process 200 moves to a state 220 wherein initial process gases are injected into the process chamber through the injectors. Preferably, the flow of the process gases from the injectors is substantially parallel to a surface of the substrate, preferably forming a horizontal laminar flow through the process chamber. Once the initial process gases have been injected into the process chamber, the process 200 moves to a decision state 230 to determine whether any injector adjustments are necessary prior to additional steps in the manufacturing process.

If no valve adjustments are needed, then the process 200 moves to a state 240 wherein the substrate processing is continued. In one embodiment, this continued processing comprises the introduction of an additional, different gas into the process chamber. In other embodiments, the same gas is continually introduced into the process chamber. After the further processing is performed at the state 240, the process 200 moves to a decision state 250 to determine if any additional process steps are required before the substrate processing is complete. If no further processing steps are required, the process 200 terminates at an end state 260. However, if additional process steps are required, the process 200 returns to decision state 230 to determine if the electronic valves in the injectors need to be adjusted prior to initiating the new process step.

If, however, an adjustment to the valves is necessary prior to continuing the manufacturing process, then the process 200 moves to a state 270 to determine the new valve position settings. Preferably, the computer controlling the valves is running a predetermined recipe which determines the new valve settings for the next process step. However, it should be realized that the computer may use input from the earlier processes as part of a feedback loop when determining the proper valve settings. For example, if a determination was made through a feedback loop that an earlier process step resulted in excess deposition at edges of the wafer, the computer may determine that the following process step should be altered to reduce relative flow from the peripheral injectors 18A, 18E. This manufacturing flexibility through the use of electronically controlled injectors provides advantages over earlier manual systems.

Once the new valve positions are determined at the state 270, the process 200 moves to a state 280 wherein the electronic valves within the injectors are adjusted to output the next reaction gas in the proper distribution pattern. The process then returns to the state 240 to continue processing with the newly adjusted injector settings.

In one preferred embodiment the injectors are adjusted during the processing of a single wafer to optimize the injector settings for different process steps. For example, the injectors are adjusted from a setting optimized for depositing a layer upon a wafer and then the injector settings are adjusted for depositing a different layer on the same wafer. As a result, a single wafer can be subjected to processes which have different optimal injector settings without the need to move the wafer between specialized chambers, e.g., as normally occurs in a cluster process tool.

In another preferred embodiment the computer effectuates the adjustment of the injectors during a pre-deposition stage of a recipe step. For example, during the execution of a multi-step recipe, the computer can adjust the injectors to be optimized for a non-deposition step, such as a hydrogen bake step, and then, following the completion of the non-deposition step, adjust the injectors to be optimized for a deposition step.

In another preferred embodiment the injectors are adjusted to allow the cleaning of a reaction chamber between one or more deposition steps. For example, deposition processes are conducted in the reaction chamber until unwanted deposition on the chamber walls reaches a predetermined thickness. At this point the injectors are adjusted for the injection of cleaning agents (e.g., etchants) into the chamber. As would be appreciated by the skilled artisan, the desired flow profile for a chamber etch step and a substrate deposition step differ, and adjusting the injectors allows for the creation of individual flow profiles optimized for each of these steps. In these embodiments, adjusting the relative flow rate of the injectors produces a change in the distribution of the gases which the injectors inject into the chamber. For example, the injectors can be adjusted to direct more of an etch flow towards equipment surfaces that are more subject to deposition build-up (e.g., the chamber walls) during a chamber etch and, then, subsequently adjusted to direct a laminar flow evenly across a substrate surface during a deposition step. Preferably, the total time between a deposition step and a chamber clean step, including adjustment of injectors and unloading the substrate, is less than 60 seconds, more preferably less than 30 seconds. After cleaning, the injectors are adjusted to settings appropriate for deposition. For example, the desired deposition configuration for the injectors in certain processes is a laminar flow of the injected gases. In this way, the injector settings can be optimized for different processes.

In one preferred embodiment, the injectors are adjusted once during a process step (or deposition of a single functional layer), while in another preferred embodiment, the gas injectors are adjusted 2 to 15 times during process cycle for one wafer. The gas injectors can also be adjusted continuously during a process cycle (e.g., when grading a layer). Preferably, the process cycle lasts from about 0.1 seconds to about 2 minutes, more preferably from about 3 seconds to about 1 minute. In one preferred embodiment the computer comprises injector control software using software with pre-set adjustment controls, while in an alternate embodiment the computer includes injector control software which controls the injectors based on real-time feedback, as discussed above. Adjustments can be incremental or continuous, and can take place between process steps or while process gases continue to flow.

In one preferred embodiment the gas flow is injected from laterally arrayed injectors into an inlet plenum, but in an alternate preferred embodiment the gas is injected directly into the chamber. Preferably, gases supplied to the individual injectors are mixed prior to injection in a manifold, but in an alternate embodiment the gases are mixed after the injection.

The preferred embodiments allow for the relative adjustment of injectors horizontally across a linear plane, as compared with the adjustment of injectors across a circular plane (e.g., showerheads) in the prior art. Preferably, the resulting flow is a horizontal flow through the length of the chamber and across the surface of the substrate. However, in an alternate embodiment the linearly arrayed injectors do not create a horizontal flow through the length of the chamber, e.g., the injectors are arrayed directly above the substrate surface. In this alternate embodiment, adjusting the injectors can, for example comprise, selecting a series of injectors to inject from these selected injectors while altering relative flow injected from the other injectors forming the injector bank, e.g., a showerhead.

In another preferred embodiment, the computer adjusts the output of the injectors during a deposition step in order to deposit a graded layer on the substrate. Thus, the injectors can be adjusted during the deposition of a single functional layer (e.g., a single conductive layer). In one example, a method is provided for grading a layer of an integrated circuit (e.g., a graded silicon germanium (SiGe) layer) to have a ratio of a component X (e.g., silicon (Si)) to a component Y (e.g., germanium (Ge)) which varies through the vertical thickness across the substrate. In this embodiment, a gas is injected from injectors onto a substrate. The configuration of the electronic valves within the injectors is then altered, preferably through computer control, during a functional layer deposition step. In one preferred embodiment, a first sub-layer is formed on the substrate, with the first sub-layer having a first proportion of the component X relative to the component Y. The electronic valves are then adjusted and a second sub-layer is then formed on the first sub-layer. In this embodiment, the second sub-layer has a second proportion of the component X relative to the component Y and the first and second proportions are different. In one arrangement the first proportion is greater than the second proportion, while in another arrangement the first proportion is less than the second proportion.

In yet another arrangement, the electronic valves are again adjusted, and a third sub-layer having a third proportion different than the first and second proportion is deposited. In one arrangement, the conductivity of the overall layer is highest closest to the substrate, while in another arrangement the conductivity of the functional layer (e.g., a $TiN_x$ or other metal nitride barrier layer) is lowest closest to the substrate. In still another arrangement, the germanium content of a graded, heteroepitaxial $Si_xGe_{1-x}$ layer decreases as deposition proceeds.

In another embodiment, a continuously graded layer is deposited, by preferably continuously varying the aperture of each injector valve during deposition of the graded layer. The graded layer formed is preferably a single functional layer in an integrated circuit. Preferably, the injector settings are tuned or optimized during recipe design and pre-programmed for operation.

Layers which can be formed using the preferred embodiments include, but are not limited to, silicon-containing materials, including Si, $Si_{1-x}C_x$, $Si_{1-x}Ge_x$, $Si_{1-x-y}Ge_xC_y$, Ge, $Ge_{1-x}C_x$ and the foregoing materials doped with electrically active dopants (including, e.g., B, P, As, Sb and In). Source gases for these layers can include, for example, $H_xSiCl_{4-x}$ (x=0-3), $H_{2n+2}Si_n$ (n=1-3), $H_{2n+2}Ge_n$ (n=1-3), $H_xGeCl_{4-x}$ (x=0-3), $B_2H_6$, $AsH_3$, $PH_3$, $SbD_3$, $(SiH_3)_{3-x}MH_x$ (x=0-2, M=P, As), $(SiH_3)_{4-x}CH_x$ (x=0-3) and diluted mixtures of the foregoing (generally with ultra-high purity (UHP) hydrogen). Preferably, a UHP carrier gas is also used during all processing, such as, for example, $H_2$, $N_2$, He or Ar.

The following examples are provided in order to illustrate certain preferred embodiments and should not be construed to limit the invention in any way.

EXAMPLES below, the total dynamic range of the injectors is defined by injector settings ranging from 0-5 where 0 represents the fully closed valve position and 5 represents the fully open valve position. In the following examples there are five individual injectors that are independently adjusted by an adjustment mechanism controlled by a computer. Recipes with pre-set injector settings are empirically determined beforehand and pre-loaded on the computer using control software. Typical injector operating ranges lie between 0.1 and 4.9. Injector 18C is located at the center of the injector block (e.g., block 16 on FIG. 2), which is rectangular in shape.

Example 1

A substrate is loaded into an Epsilon® E-3000 reactor chamber, commercially available from ASM America, Inc. of Phoenix, Ariz., under a flow of 20 slm of ultra high purity (UHP) $H_2$ atmospheric pressure. The wafer is then rotated at 35 rpm and the temperature is increased to 950° C. The substrate is allowed to stabilize under these conditions for 2 minutes and the pressure is then reduced to 40 Torr while maintaining the 20 slm UHP $H_2$ flow. The substrate temperature is then reduced to 630° C. and allowed to stabilize under these conditions. Throughout these steps, the injectors are set using computer control, as follows:

| Injector | Setting |
|---|---|
| 1 | 1.60 |
| 2 | 1.80 |
| 3 | 2.00 |
| 4 | 1.80 |
| 5 | 1.60 |

A flow of 50 sccm $H_2/Si_3H_8$ ("Gas A"), which is formed in a bubbler maintained at 21° C., 4 PSIG pressure, is then added to the flow of 20 slm $H_2$ and directed over the substrate and into the exhaust for 30 seconds to deposit an epitaxial silicon film that is 100 Å thick. The thickness non-uniformity of the silicon film is 0.4%, as determined by a 99 point linear diameter scan of the film thickness (e.g., as measured through indirect device performance measurements, or by employing secondary ion mass spectrometry (SIMS) using the substrate dopant as a measurement marker). During the silicon deposition step, a flow of 80 SCCM of $GeH_4$ (10%)/$H_2$ (90%) ("Gas B") is flowed to the supply line of the gas vent (i.e., a line bypassing the chamber and leading to the exhaust vent). The injector settings are then changed to the following values while the $H_2$ is flowed to the chamber and Gas A and Gas B are flowing to the gas vent:

| Injector | Setting |
|---|---|
| 18A | 1.75 |
| 18B | 2.00 |
| 18C | 2.15 |
| 18D | 2.00 |
| 18E | 1.75 |

The flows of Gas A and Gas B are then combined with the H$_2$ flow and directed over the surface of the substrate for 1 minute to deposit a Si$_{80}$Ge$_{20}$ film that is 400 Å thick. The film thickness non-uniformity is 0.3% and the germanium concentration non-uniformity is 0.1 at. % as determined by a 99 point linear diameter scan using spectroscopic ellipsometry. Next, the flow of Gas B is terminated and the flow of Gas A is directed to the gas panel vent, while the H$_2$ flow is maintained to the chamber. The injectors are then returned to their original settings and the flow of Gas A is then directed over the surface of the substrate for an additional 1 minute to deposit a silicon film that is 200 Å thick. The silicon film thickness non-uniformity is 0.4%, as determined by a 99 point linear diameter scan using spectroscopic ellipsometry.

Example 2

Example 2 includes the steps outlined in Example 1, but includes the following modifications: A flow of 10 sccm of H$_3$CSiH$_3$ (20%, balance H$_2$) ("Gas C") and a flow of 30 sccm of B$_2$H$_6$ (100 PPM, balance H$_2$) ("Gas D"), are added during the Si$_{80}$Ge$_{20}$ deposition step with injector settings of:

| Injector | Setting |
| --- | --- |
| 18A | 1.83 |
| 18B | 2.09 |
| 18C | 2.25 |
| 18D | 2.09 |
| 18E | 1.83 |

The concentrations of the components in the layer resulting from Gas C and Gas D (i.e., carbon and boron, respectively) are highly uniform throughout the film thickness as measured by electrical measurements (i.e., 4 point probe for boron and high resolution X-Ray diffraction for carbon).

Example 3

Example 3 includes the steps outlined in Example 1, but includes the following modifications below in order to deposit a multilayer structure, including graded layers.

Figure 7:
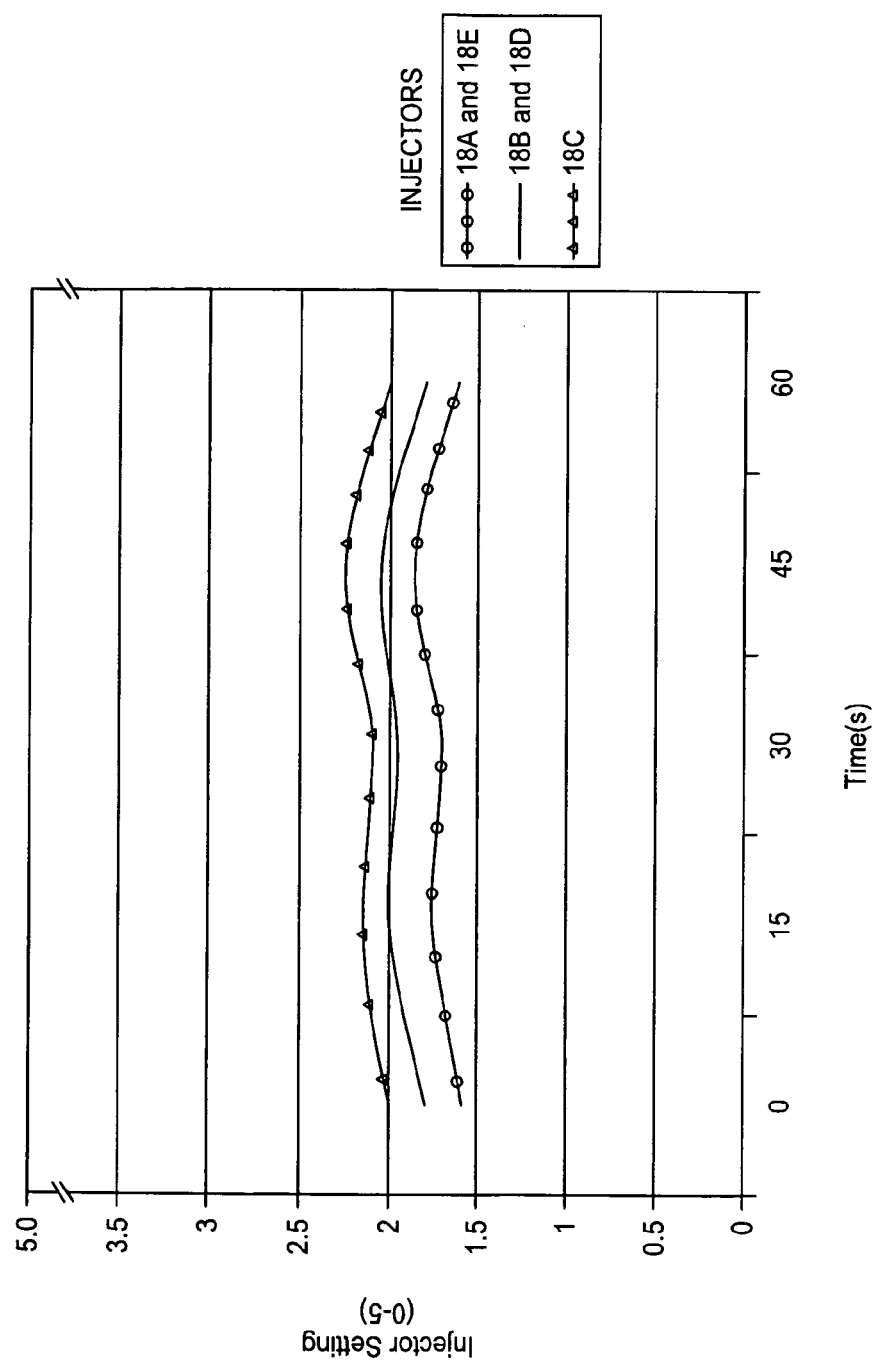
FIG. 7 is a graphical representation of the computer controlled injector settings over time from the process recipe of Example 3.

FIG. 7 shows a graphical representation of the injector settings during the process of Example 3 over time, in one embodiment.

The flow of Gas B is ramped from 0 sccm to 80 sccm into the chamber over 15 seconds, while the injectors are ramped from their initial settings to their final settings over 15 seconds:

| Injector | Initial Setting | Final Setting |
| --- | --- | --- |
| 18A | 1.60 | 1.75 |
| 18B | 1.80 | 2.00 |
| 18C | 2.00 | 2.15 |
| 18D | 1.80 | 2.00 |
| 18E | 1.60 | 1.75 |

The flows of Gas A and Gas B from Example 1 and H$_2$ are maintained to the chamber for 30 seconds. The flow of Gas B is then ramped from 80 sccm to 40 sccm while the injectors are ramped from their initial to their final settings over 20 seconds:

| Injector | Initial Setting | Final Setting |
| --- | --- | --- |
| 18A | 1.75 | 1.70 |
| 18B | 2.00 | 1.95 |
| 18C | 2.15 | 2.10 |
| 18D | 2.00 | 1.95 |
| 18E | 1.75 | 1.70 |

While maintaining the flow of Gas A and Gas B to vent and the flow of H$_2$ to the chamber, a flow of 5 sccm of Gas C (from Example 2) and 35 sccm of Gas D (from Example 2) is added to the gas panel vent line. The injector settings are then changed while the reactants flow to vent after the previous injector setting adjustment to the following settings:

| Injector | Setting |
| --- | --- |
| 18A | 1.85 |
| 18B | 2.05 |
| 18C | 2.25 |
| 18D | 2.05 |
| 18E | 1.85 |

The gases are then all introduced to the chamber and allowed to flow across the substrate surface for 5 seconds, while the injectors are maintained at these settings. All gas flows except the H$_2$ are abruptly switched to the gas vent and the flows of Gas C and Gas D are then terminated altogether. The flows of Gas A and Gas B are then redirected to the reaction chamber and the flow of Gas B is ramped from 40 sccm to 0 sccm over 25 seconds while the injectors are ramped from their initial settings to their final settings over 25 seconds:

| Injector | Initial Setting | Final Setting |
| --- | --- | --- |
| 18A | 1.85 | 1.60 |
| 18B | 2.05 | 1.80 |
| 18C | 2.25 | 2.00 |
| 18D | 2.05 | 1.80 |
| 18E | 1.85 | 1.60 |

Example 4

Figure 8:
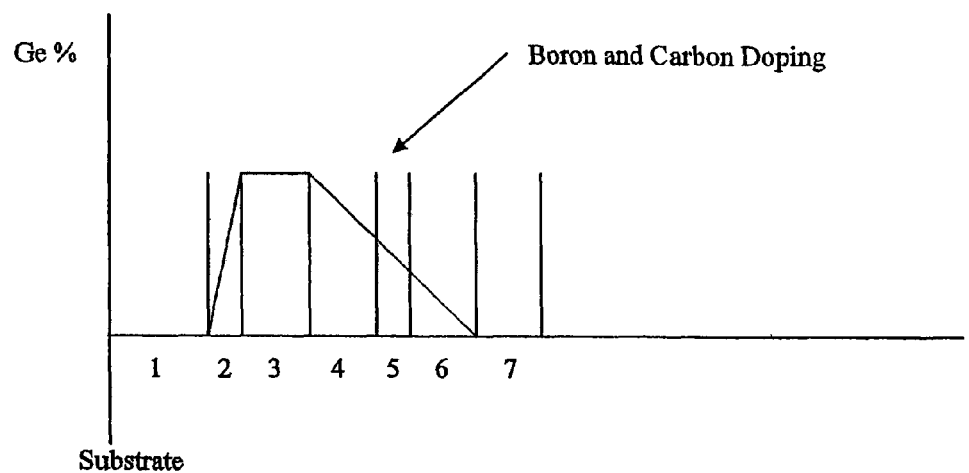
FIG. 8 is a graphical representation of germanium source flow rate for Example 4.

Example 4 is illustrated with reference to FIG. 8, which is a target plot of deposited germanium concentration over time. The plot is divided into regions 1-7, which represent temporal increments as well as thickness regions of the films deposited on the substrate. This example provides only qualitative descriptions of the gas flow rates and injector settings.

The process begins with region 1, which is characterized by epitaxial silicon growth on the substrate. In region 1, Gas A (a mixture of a silicon source such as Si$_3$H$_8$ and a carrier gas such as H$_2$) is introduced at a constant flow rate into the chamber and directed over the substrate. Region 1 may last for, e.g., 30 seconds. During this time period, the injector settings are set at a first condition X$_1$. In one embodiment, each of regions 1-7 involves the introduction of Gas A at the same constant flow rate.

Region 2 is characterized by epitaxial growth of Si$_{1-x}$Ge$_x$, with the germanium concentration x graded up. In region 2, Gas B (a mixture of a germanium source such as GeH$_4$ and a carrier gas such as H$_2$) is introduced into the chamber and directed over the substrate, with Gas A being held steady at a steady flow rate (preferably the same flow rate as in region 1). The flow rate of Gas B is ramped up from 0 to some value (e.g., 80 sccm) over some time period (e.g., 15 seconds). In region 2, the injector settings are also adjusted. In one option, the injector settings can be increased (i.e., opened more) to a condition $X_2$ immediately at the start of region 2. Alternatively, the injector settings can be ramped from $X_1$ to $X_2$ over the time period of region 2.

Region 3 is characterized by epitaxial growth of $Si_{1-x}Ge_x$, with the germanium concentration x at a constant peak level. In region 3, Gases A and B flow into the chamber above the substrate, both at steady flow rates. Gas B is held steady at the flow rate to which it was ramped in region 2. In region 3, the injector settings are maintained at a constant condition $X_3$ that is the same as their condition at the end of region 2. In other words, $X_3$ is the same as $X_2$. Region 3 may last for, e.g., 30 seconds.

Region 4 is characterized by epitaxial growth of $Si_{1-x}Ge_x$, with the germanium concentration x graded down to a boron and carbon doping level. In region 4, the flow rate of Gas B is ramped downward from the level it was at in region 3 to a lower level (e.g. from 80 to 40 sccm), while the flow rate of Gas A is held steady. The ramp rate of Gas B depends upon the desired slope of the gradation of the germanium concentration. The time period of region 4 may be, e.g., 20 seconds. In region 4, the injector settings are also adjusted. In one option, the injector settings are decreased (closed more) from condition $X_3$ to a condition $X_4$ at the beginning of region 4. In another option, the injector settings are ramped from $X_3$ to $X_4$ over the time period of region 4. In either case, $X_1 < X_4 < X_3$.

Region 5 is characterized by epitaxial growth of $Si_{1-x-y}Ge_xC_y$ doped with boron, with a continued downward gradation of the germanium concentration x. In region 5, Gas C (a mixture of a carbon source such as $H_3CSiH_3$ and a carrier gas such as $H_2$) and Gas D (a mixture of a boron source such as $B_2H_6$ and a carrier gas such as $H_2$) are introduced into the chamber over the substrate while Gas A is held at a steady flow rate and the flow rate of Gas B continues a downward ramp. In one embodiment, Gases C and D are introduced at 5 sccm and 35 sccm, respectively. The time period of region 5 may be, e.g., 5 seconds. The injector settings are adjusted at the beginning of region 5 to a condition $X_5$, wherein $X_5 > X_4$. The magnitude of $X_5$ is determined, at least in part, by the total flow rates of Gases C and D. Preferably, the deposited film has a uniform concentration of boron and carbon. The carbon can, for example, act as a diffusion barrier to retard boron diffusion.

Region 6 is characterized by epitaxial growth of $Si_{1-x}Ge_x$, with the germanium concentration x graded down to zero. In region 6, Gas A is held at a steady flow rate and the flow rate of Gas B continues a downward ramp to 0 sccm. The ramp rate of Gas B depends upon the desired slope of the gradation of the germanium concentration. The time period of region 6 may be, e.g., 25 seconds. In region 6, the injector settings are also adjusted. In one option, the injector settings are decreased (closed more) from condition $X_5$ to a condition $X_6$ at the beginning of region 6. In another option, the injector settings are ramped from $X_5$ to $X_6$ over the time period of region 6. In either case, $X_1 < X_6 < X_5$.

Region 7 is characterized by epitaxial silicon cap growth. In region 7, Gas A is held at a steady flow rate for, e.g., 25 seconds. The injector settings are adjusted to condition $X_1$ at the beginning of region 7.

Whenever the total gas flow changes, the injector settings are preferably changed as well. For an increase in total gas flow, the injectors settings are preferably increased. For a decrease in total gas flow, the injector settings are preferably decreased. A useful point of reference for the injector settings is the condition $X_1$ of region 1, in which a constant flow of a silicon source and carrier gas is used to grow the epitaxial silicon "buffer" layer.

Example 5

Example 5 includes the steps outlined in Example 4, but includes the following modifications:

The injector settings are ramped down over the same range, but with times that overlap and correspond to the downward ramp rate(s) of Gas B from the beginning of region 4 to the end of region 6, but at different ramp rates from the start to the finish.

Example 6

Prior to a deposition of a layer upon a substrate, the injectors are set to have the substrate deposition settings listed below. Subsequent to one or more deposition steps (e.g., after unwanted deposition on the chamber walls has reached an undesirable threshold) the injectors are adjusted to have the chamber etch settings shown below. An etch gas is then flowed into the chamber to clean the chamber walls. After cleaning, the injectors are adjusted back to the initial substrate deposition settings.

| Injector | Substrate Deposition Setting | Chamber Etch Setting |
|---|---|---|
| 18A | 3.00 | 1.00 |
| 18B | 2.50 | 2.90 |
| 18C | 2.00 | 4.00 |
| 18D | 2.50 | 2.90 |
| 18E | 3.00 | 1.00 |

Advantageously, the preferred embodiments allow injector settings to be optimized for each individual step, process, and/or phase in a processing recipe.

Advantageously, in certain preferred embodiments a layer is graded by programming a computer to adjust the injectors during a deposition step or mid-recipe, while the substrate(s) remain housed in the process chamber. As a result, a functional layer can be deposited, in a single step, to have a composition which varies across the height of the layer but demonstrates uniformity at each stage of deposition. Accordingly, a single layer can be bulk deposited to have graded composition at different levels within the layer (e.g., graded lattice constant for $Si_xGe_{1-x}$ or graded conductivity for $TiN_x$).

Another advantage is the ability to adjust the injectors to separately optimize the cleaning of a reaction chamber between one or more deposition steps.

Yet another advantage of the preferred embodiments is the ability to adjust the injectors during the processing of a single wafer to optimize the injector settings for different process steps (e.g., one setting for depositing a first layer upon a wafer and then adjusting the injector settings for depositing a second layer on the same wafer).

An advantage of the preferred embodiments is that the injector settings can be adjusted without having to shut the tool down so that the operator can access the injector setting mechanism.

Another advantage of certain preferred embodiments, is the ability to control a plurality of injectors with a computer, rather than necessitating manual control by an operator. As a result, wafer processing is expedited, while control is more precise through the elimination of operator error. In addition, the computer control of multiple injectors offers such quick and precise control that the execution of very complex processing adjustment by control software on the computer is made possible. In the instance of the deposition of graded layers, the multiple, highly precise adjustments (e.g., 30 adjustments during a 3 second step) would not be feasible through manual operation, while software executed by the computer can meet the requirements of graded layers.

An advantage of preferred embodiments employing real-time processing feedback sensors is the ability to the correct (or partially alleviate) certain undesirable layer characteristics during a processing step. As a result, in the instance of correctable errors, it is possible to both increase the precision of a deposition/etch step and, also, reduce the number of "scrapped" wafers.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

We claim:

1. A substrate processing system comprising:
   a horizontal gas flow reaction chamber having an enclosed reaction space there within, said horizontal flow reaction chamber having a deposition reaction gas inlet opening and a gas outlet opening, wherein the inlet and outlet openings are substantially horizontally aligned;
   a substrate holder in the reaction space;
   a computer; and
   a plurality of injectors configured to produce a substantially horizontal unidirectional reaction gas flow through the inlet opening and directed toward the substrate holder and the outlet opening, each one of the plurality of injectors having an injector control mechanism operatively connected to the computer, wherein the injectors are positioned relative to the reaction chamber to control distribution of the horizontal unidirectional reaction gas flow across a width of the reaction chamber at a single moment in time, the width of the reaction chamber being oriented substantially horizontally in a direction substantially perpendicular to a direction of the horizontal unidirectional reaction gas flow;
   wherein the computer is programmed to selectively send control signals to the injector control mechanisms at pre-set times during a substrate deposition process recipe.

2. The system of claim 1, wherein the computer and the injector control mechanisms are configured to control the injectors during a single process step.

3. The system of claim 1, wherein the processing system is configured for chemical vapor deposition (CVD).

4. The system of claim 1, wherein:
   each of the injectors includes a valve configured to stably occupy a 100% open position of maximum openness, a 0% open position in which the valve is completely closed, and a plurality of intermediate positions having different degrees of openness, such that an amount of gas flow through the valve depends upon the position of the valve;
   each injector's injector control mechanism is adjustable to vary the position of the injector's valve;
   the valves are laterally arrayed at the reaction gas inlet opening across a width of the reaction chamber; and
   the computer is programmed with pre-set injection controls for independently adjusting the injection control mechanisms of the injectors to pre-set states, including at least some states in which at least one of the injector's valves stably occupies one of the intermediate positions between the 0% open position and the 100% open position.

5. An injection system for use in a substrate process chamber, comprising: a bank of laterally arrayed injectors operatively connected to a horizontal gas flow reaction chamber, said horizontal flow reaction chamber having a deposition reaction gas inlet opening and a gas outlet opening, wherein the inlet and outlet openings are substantially horizontally aligned, and the laterally arrayed injectors are positioned relative to the reaction chamber to produce a substantially horizontal reaction gas flow through the inlet opening into the reaction chamber, the injectors configured to control distribution of the horizontal reaction gas flow across a width of the reaction chamber at a single moment in time, the width of the reaction chamber being oriented substantially horizontally in a direction substantially perpendicular to a direction of the horizontal reaction gas flow; and a computer-controlled injector adjustment mechanism for adjusting the injectors, the mechanism having a computer interface that is controllable by a computer; wherein the computer is programmed to control the injector adjustment mechanism so as to set the injectors to pre-set states in which a variation in degrees of openness of the valves is symmetrical across the width of the reaction chamber.

6. The system of claim 5, further comprising:
   a computer having injector adjustment mechanism control software; and
   an electronic link between the computer and an interface of the injector adjustment mechanism, the link configured to transmit a control signal from the computer to the injector adjustment mechanism.

7. The system of claim 5, wherein the bank of laterally arrayed injectors is flush with a sidewall of the chamber.

8. The system of claim 5, wherein the injector adjustment mechanism is configured to independently adjust each injector in the bank of laterally arrayed injectors.

9. The system of claim 5, wherein the bank of laterally arrayed injectors is configured to be inset from a sidewall of the chamber.

10. The system of claim 9, wherein the bank of laterally arrayed injectors is configured to inject reaction gas into a horizontal inlet flange.

11. The system of claim 5, wherein the bank of laterally arrayed injectors is configured to produce a substantially horizontal unidirectional reaction gas flow through the reaction chamber from the inlet opening to the outlet opening.

12. The system of claim 1, wherein the plurality of injectors is configured to receive a mixture of a carrier gas and at least one reactant vapor, such that the injectors substantially simultaneously receive different portions of the same gas mixture, each of the injectors configured to independently regulate a flow rate of the mixture into the reaction chamber at a unique location relative to the other injectors.

13. The system of claim 5, wherein the injectors are substantially linearly aligned at the inlet opening across the width of the reaction chamber.

14. The system of claim 5, wherein:
each of the injectors includes a valve configured to stably occupy a 100% open position of maximum openness, a 0% open position in which the valve is completely closed, and a plurality of intermediate positions having different degrees of openness, such that an amount of gas flow through the valve depends upon the position of the valve; and
the computer is programmed to control the injector adjustment mechanism so as to set the injectors to pre-set states, including at least some states in which at least one of the injector's valves stably occupies one of the intermediate positions between the 0% open position and the 100% open position.

15. The system of claim 14, wherein the computer is programmed to control the injector adjustment mechanism so as to set at least some of the injectors to different pre-set states.

* * * * *

UNITED STATES PATENT AND TRADEMARK OFFICE
CERTIFICATE OF CORRECTION

| | | |
|---|---|---|
| PATENT NO. | : 8,088,223 B2 | Page 1 of 1 |
| APPLICATION NO. | : 11/373408 | |
| DATED | : January 3, 2012 | |
| INVENTOR(S) | : Todd et al. | |

It is certified that error appears in the above-identified patent and that said Letters Patent is hereby corrected as shown below:

IN THE SPECIFICATIONS:

In column 10, line 7, please change "below," with -- In Examples 1-5 below, --

In column 10, line 17, please change "on" with -- in --

In column 10, line 24, please change "$H_2$" with -- $H_2$ at --

IN THE CLAIMS:

In column 15, line 32, claim 1, please change "there within," with -- therewithin, --

Signed and Sealed this
Twenty-second Day of May, 2012

David J. Kappos
*Director of the United States Patent and Trademark Office*